(12) United States Patent
Yagiura et al.

(10) Patent No.: US 8,049,096 B2
(45) Date of Patent: Nov. 1, 2011

(54) SOLAR BATTERY MODULE

(75) Inventors: Toshio Yagiura, Kobe (JP); Shingo Okamoto, Toyonaka (JP); Atsushi Nakauchi, Kaizuka (JP)

(73) Assignee: SANYO Electric Co., Ltd., Moriguchi-shi (JP)

(*) Notice: Subject to any disclaimer, the term of this patent is extended or adjusted under 35 U.S.C. 154(b) by 418 days.

(21) Appl. No.: 11/699,985

(22) Filed: Jan. 31, 2007

(65) Prior Publication Data

US 2007/0175509 A1    Aug. 2, 2007

(30) Foreign Application Priority Data

Feb. 1, 2006    (JP) ................... 2006-025134

(51) Int. Cl.
*H01L 31/0325* (2006.01)
(52) U.S. Cl. ............................................ 136/244
(58) Field of Classification Search ........... 136/243–265
See application file for complete search history.

(56) References Cited

U.S. PATENT DOCUMENTS

2003/0010377 A1* 1/2003 Fukuda et al. ............... 136/251
2003/0201007 A1* 10/2003 Fraas et al. ................... 136/246

FOREIGN PATENT DOCUMENTS

| JP | 51-132973 A | 10/1976 |
| JP | 9-148601 A | 6/1997 |
| JP | 11-354822 A | 12/1999 |
| JP | 2001-094127 A | 4/2001 |
| JP | 2001-94127 A | 4/2001 |
| JP | 2003-86819 A | 3/2003 |
| JP | 2003-086819 A | 3/2003 |

OTHER PUBLICATIONS

Machine translation of JP 9148601 published on Jun. 1997 by Tsujimoto et al.*
Office Action dated Jul. 24, 2009 issued in corresponding Chinese patent Application No. 200710006513.3.
Japanese Office Action dated Jan. 18, 2011, issued in corresponding Japanese Patent Application No. 2007-019036.

* cited by examiner

*Primary Examiner* — Basia Ridley
*Assistant Examiner* — Christina Chern
(74) *Attorney, Agent, or Firm* — Westerman, Hattori, Daniels & Adrian, LLP

(57) ABSTRACT

A solar battery cell having a hexagonal shape is divided into four at a straight line connecting between opposed apexes and a straight line connecting between middle points of opposed sides. Two of the divided cells are arranged without being turned upside down such that oblique sides thereof oppose each other; thus, a substantially rectangular-shaped unit is configured. In adjoining two units, an interconnector is routed from a front surface of one of the units to a back surface of the other unit. Thus, the two units are electrically connected to each other through the interconnector. Hence, it is unnecessary to route an interconnector from a front surface of one divided cell to a back surface of another divided cell at a portion where oblique sides of the divided cells oppose each other; therefore, it is unnecessary to secure a large clearance at the portion.

9 Claims, 13 Drawing Sheets

EXAMPLE OF CONNECTION BETWEEN UNITS

SECTIONAL VIEW TAKEN ALONG LINE C-C'

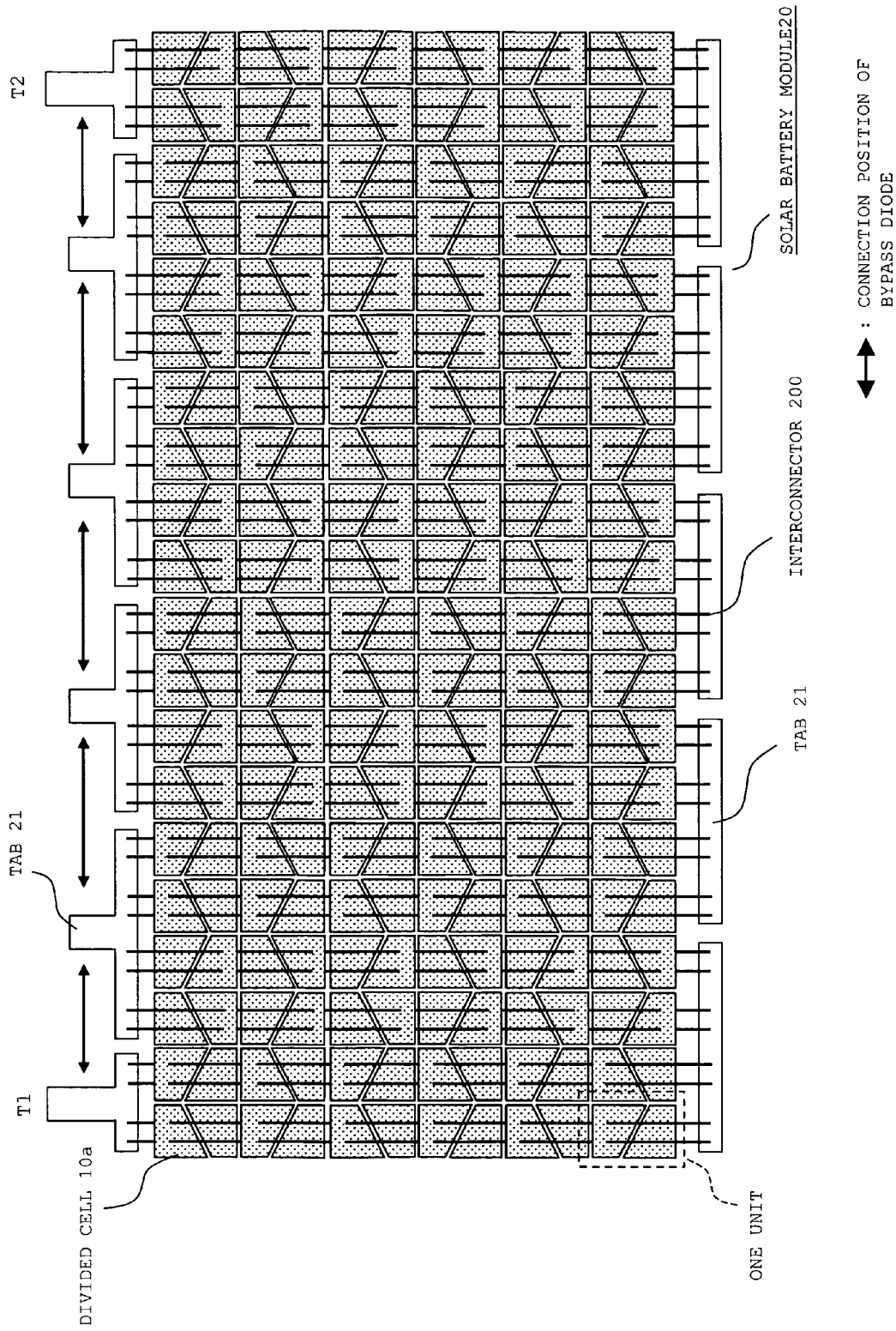

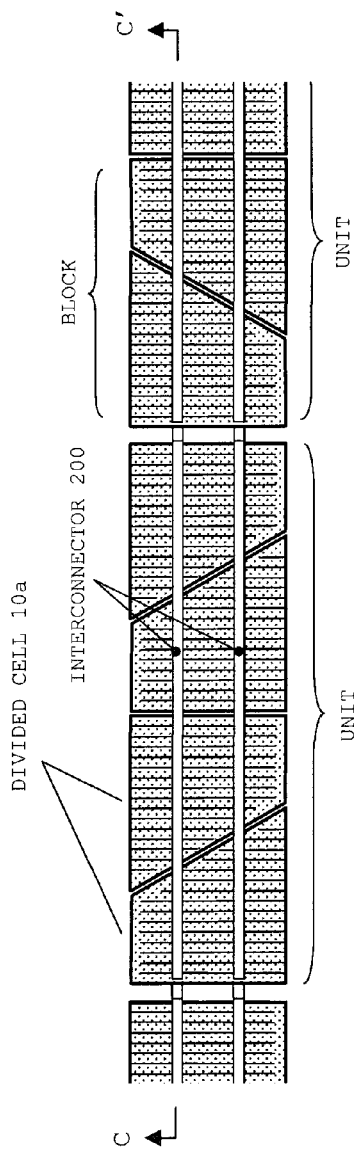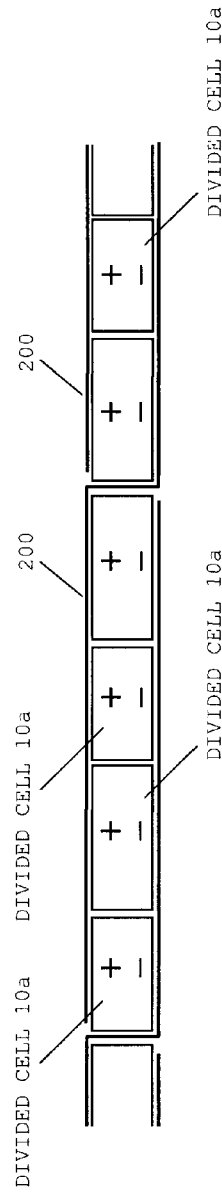

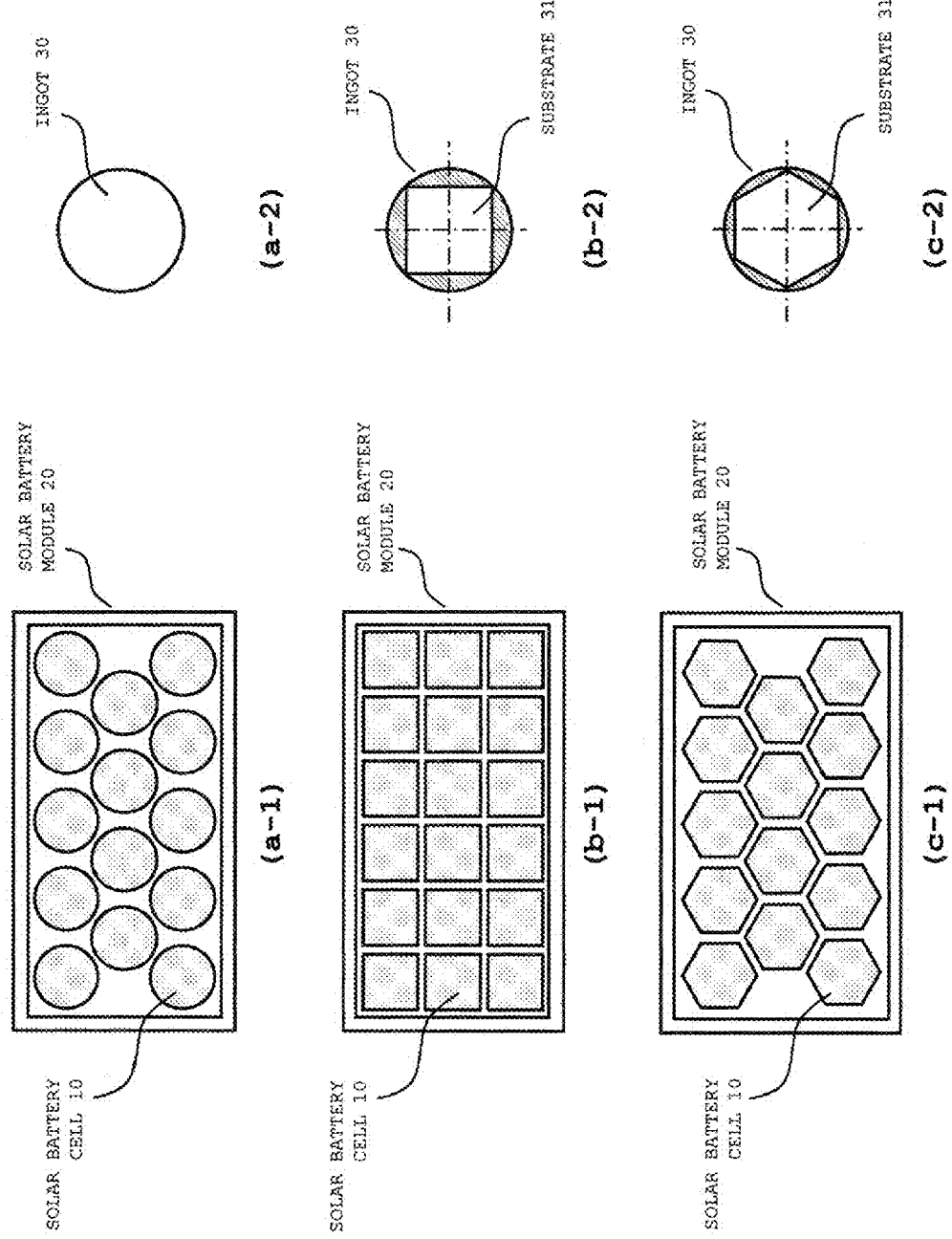

SOLAR BATTERY MODULE

This application claims priority under 35 U.S.C. §119 of Japanese Patent Application No. 2006-25134 filed Feb. 1, 2006.

BACKGROUND OF THE INVENTION

1. Technical Field of the Invention

The present invention relates to solar battery modules, in particular, a solar battery module suitably used when solar battery cells are efficiently placed thereon as much as possible.

2. Disclosure of Related Art

Against a backdrop of problems such as exhaustion of oil resources and global warming, recently, development and popularization of a clean energy source employing no oil resources are mentioned as a global challenge. A photovoltaic power generating system uses inexhaustible photovoltaic energy without emission of $CO_2$ or the like and, therefore, receives attention as a solution for such problems.

In order to protect a solar battery cell which is a power generating source from external damage and improve handleability, the photovoltaic power generating system typically uses a solar battery module including several tens of solar battery cells arranged on a plane. Herein, the solar battery module is typically formed into a rectangular shape having a side of about one meter in order to efficiently arrange solar battery cells in a certain area and to improve handleability upon transfer or installation thereof.

On the other hand, an ingot (single crystal silicon) used as a material for a substrate of a solar battery cell is formed into a cylindrical shape because of its manufacturing method. Therefore, when a substrate of a solar battery cell is obtained by slicing the ingot, the solar battery cell is inevitably formed into a circular shape. Herein, even when solar battery cells are efficiently placed on a solar battery module as much as possible, a large clearance is created between adjoining solar battery cells as illustrated in (a-1) and (a-2) of FIG. 11, for example. Consequently, there arises a problem that solar battery cells 10 to be placed on a solar battery module 20 are small in number.

In order to solve this problem, a solar battery cell 10 is formed into a square shape as illustrated in (b-1) and (b-2) of FIG. 11. Thus, solar battery cells 10 to be placed on a solar battery module 20 can be increased in number. However, there arises another problem that wasted portions (hatched portions in (b-2) of FIG. 11) from which a substrate 31 can not be obtained become large in an ingot 30, that is, the ingot 30 can not be used efficiently.

Alternatively, a solar battery cell 10 is formed into a hexagonal shape as illustrated in (c-1) and (c-2) of FIG. 11. Thus, solar battery cells 10 to be placed on a solar battery module 20 can be increased in number as compared with the case that the solar battery cell 10 is formed into a circular shape. Further, an ingot 30 can be used more efficiently as compared with the case that the solar battery cell 10 is formed into a square shape. Also in this case, however, a clearance where a solar battery cell 10 can not be placed is created in the solar battery module 20, and wasted portions from which a substrate 31 can not be obtained still remain in the ingot 30.

In order to solve these problems, JP2001-094127A discloses a solar battery module by which solar battery cells 10 to be placed thereon can be increased in number and an ingot 30 an be used efficiently. According to this prior invention, a substrate 31 is cut out from the ingot 30 so as to have a hexagonal shape which is larger than a hexagonal shape inscribed in an outer periphery of the ingot 30 and is smaller than a hexagonal shape inscribed by the outer periphery of the ingot 30 (hereinafter, a shape cut out in this manner will be referred to as an "almost hexagonal shape"), as illustrated in FIG. 12B. Thus, wasted portions from which a substrate 31 can not be obtained can be reduced in the ingot 30, that is, the ingot 30 can be used efficiently.

In this prior invention, further, a solar battery cell 10 including such a substrate 31 cut out as described above is divided into two or four at a line P-P' and/or a line Q-Q' in FIG. 12B. Then, the divided solar battery cells 10 are arranged as illustrated in FIG. 12A or 12C. Thus, a clearance where a solar battery cell 10 can not be arranged is reduced in a solar battery module 20, that is, solar battery cells 10 to be placed on the solar battery module 20 can be increased in number.

Alternatively, JP09-148601A (1997) discloses the following configuration. That is, a solar battery cell having a hexagonal shape or an almost hexagonal shape is divided into two at a straight line connecting opposed apexes or a straight line connecting two division points on opposed sides. Then, the divided solar battery cells are placed on a solar battery module. FIG. 13A illustrates the configuration of the solar battery module according to this prior invention, and FIG. 13B is a sectional view taken along a line R-R' in FIG. 13A.

According to this prior invention, solar battery cells 10 are placed on the solar battery module 20 such that identical polarities thereof are directed in a single direction. Then, an interconnector 21 connects between a front surface or a back surface of one of adjoining solar battery cells 10 and a back surface or a front surface of the other solar battery cell 10; thus, the solar battery cells 10 are electrically connected to each other.

With the configuration in JP09-148601A, however, oblique sides of divided cells oppose each other, and an interconnector is routed from a front surface of one cell to a back surface of another cell at a portion where the oblique sides of the divided cells oppose each other. Consequently, there arises a problem that a clearance at the portion becomes relatively large, so that solar battery cells to be placed on a solar battery module are reduced in number. In addition, the interconnector routed at the portion readily causes chipping or cracking of the divided cells, so that there may arise a problem that a divided cell is damaged. Further, in a case that a plurality of interconnectors are used for connection between adjoining divided cells, the interconnectors are disadvantageously bent at an oblique side of the divided cell. Consequently, a position at which an interconnector is bent in an oblique side differs for each interconnector, so that there arises a problem that connection work using an interconnector becomes complicated.

Moreover, JP2001-094127A discloses no interconnection between divided cells using an interconnector.

SUMMARY OF THE INVENTION

An object of the present invention is to provide a solar battery module having the following advantages. That is, in a case that divided solar battery cells are placed in the solar battery module as described above, solar battery cells to be placed in the solar battery module can be increased in number, the solar battery cell can be prevented from becoming chipped or cracked, and electrical connection between the solar battery cells through an interconnector can be facilitated.

According to a first aspect of the present invention, a solar battery module includes a plurality of tetragonal-shaped solar battery cells forming a substantially rectangular contour in pairs such that oblique sides of two solar battery cells oppose each other. Herein, the plurality of solar battery cells are arranged on a plane in a state that oblique sides of two solar battery cells oppose each other. Further, the solar battery cells having the oblique sides opposing each other are connected in parallel through an interconnector.

According to a second aspect of the present invention, the solar battery module according to the first aspect of the present invention includes a plurality of units each forming the substantially rectangular contour by combining two solar battery cells such that the oblique sides thereof oppose each other. Herein, the plurality of units are arranged in a matrix such that longer sides of the substantially rectangular contours thereof oppose each other and shorter sides of the substantially rectangular contours thereof oppose each other.

According to a third aspect of the present invention, the solar battery module according to the first aspect of the present invention includes a plurality of blocks each forming the substantially rectangular contour by combining two solar battery cells such that the oblique sides thereof oppose each other. Herein, the plurality of blocks are arranged such that shorter sides of the substantially rectangular contours thereof oppose each other to configure a plurality of units each having a substantially rectangular contour slenderer than the substantially rectangular contour of the block. Further, the plurality of units are arranged in a matrix such that longer sides of the substantially rectangular contours thereof oppose each other and shorter sides of the substantially rectangular contours thereof oppose each other.

According to a fourth aspect of the present invention, in the solar battery module according to the second or third aspect of the present invention, in the plurality of units, a front surface of one of adjoining two units is electrically connected to a back surface of the other unit in accordance with a predetermined electrical connection pattern in sequence.

According to a fifth aspect of the present invention, in the solar battery module according to the fourth aspect of the present invention, in a portion where shorter sides of the adjoining two units oppose each other, the interconnector is routed from a front surface of one of the units to a back surface of the other unit for electrical connection between the front surface and the back surface.

According to a sixth aspect of the present invention, in the solar battery module according to any one of the first to fifth aspects of the present invention, the solar battery cells placed on the solar battery module are identical in type to one another, and are arranged on a plane such that identical polarities thereof are directed to a single direction.

According to a seventh aspect of the present invention, a solar battery module includes a unit including a plurality of tetragonal-shaped solar battery cells forming a substantially rectangular contour in pairs such that oblique sides thereof oppose each other, and an interconnector for electrically connecting between the solar battery cells in the unit. Herein, the unit is formed into a square shape by the plurality of solar battery cells. Further, the interconnector connects between the solar battery cells configuring the unit without being routed from a front surface of one of the solar battery cells to a back surface of the other solar battery cell and vice versa at a portion where the oblique sides of the solar battery cells oppose each other.

According to an eighth aspect of the present invention, in the solar battery module according to the seventh aspect of the present invention, the plurality of solar battery cells configuring the unit are electrically connected in parallel.

The "solar battery cell" according to the respective aspects of the present invention corresponds to a divided cell 10a in the following embodiment. The "unit" according to the respective second to fifth, seventh and eighth aspects of the present invention corresponds to a unit illustrated in FIGS. 3A, 3B, 10A and 10B in the following embodiment.

The "unit" according to the second aspect of the present invention has a configuration illustrated in FIGS. 3A and 3B, and the "unit" according to the third aspect of the present invention has a configuration illustrated in FIGS. 10A and 10B. Further, the "electrical connection pattern" according to the fourth aspect of the present invention is illustrated in each of FIGS. 5 to 9 in the following embodiment.

In the respective aspects of the present invention, the "tetragonal shape" of the solar battery cell involves a shape obtained when a hexagonal shape is divided into four at a straight line which connects a pair of opposed apexes and a straight line which is perpendicular to the straight line and connects between middle points of a pair of opposed sides, and a shape obtained when an "almost hexagonal shape" illustrated in FIG. 12B, a shape formed by replacing part of or all of arcuate portions of the "almost hexagonal shape" with a straight line and a shape formed by slightly changing the "almost hexagonal shape" in side or angle is divided into four at a line P-P' and a line Q-Q' in FIG. 12B.

According to the present invention, it is unnecessary to secure a large clearance at a portion where oblique sides of two divided cells oppose each other as illustrated in FIGS. 13A and 13B; therefore, it is possible to increase the number of divided cells to be placed in a solar battery module. In addition, it is unnecessary to route an interconnector from a front surface one divided cell to a back surface of another divided cell at a portion where oblique sides of the divided cells oppose each other; therefore, it is possible to prevent the divided cells at the portion from becoming chipped or cracked.

The other effects and significances of the present invention will become more apparent from the following detailed description of an embodiment of the present invention. However, the following embodiment is by way of illustration and example only; therefore, terms of respective constituent elements are not limited to those described in the following embodiment.

BRIEF DESCRIPTION OF THE DRAWINGS

The foregoing and other objects and novel features will become more apparent from the following detailed description of the present invention when taken in conjunction with the accompanying drawings. In which:

FIG. 9 illustrates yet another unit connection pattern according to the embodiment;

FIGS. 10A and 10B illustrate modifications of the connection form between the divided cells and the connection form between the units according to the embodiment;

FIG. 11 illustrates a configuration in the prior invention;

DESCRIPTION OF PREFERRED EMBODIMENT

Hereinafter, description will be given of an embodiment of the present invention with reference to the drawings.

Figure 1:
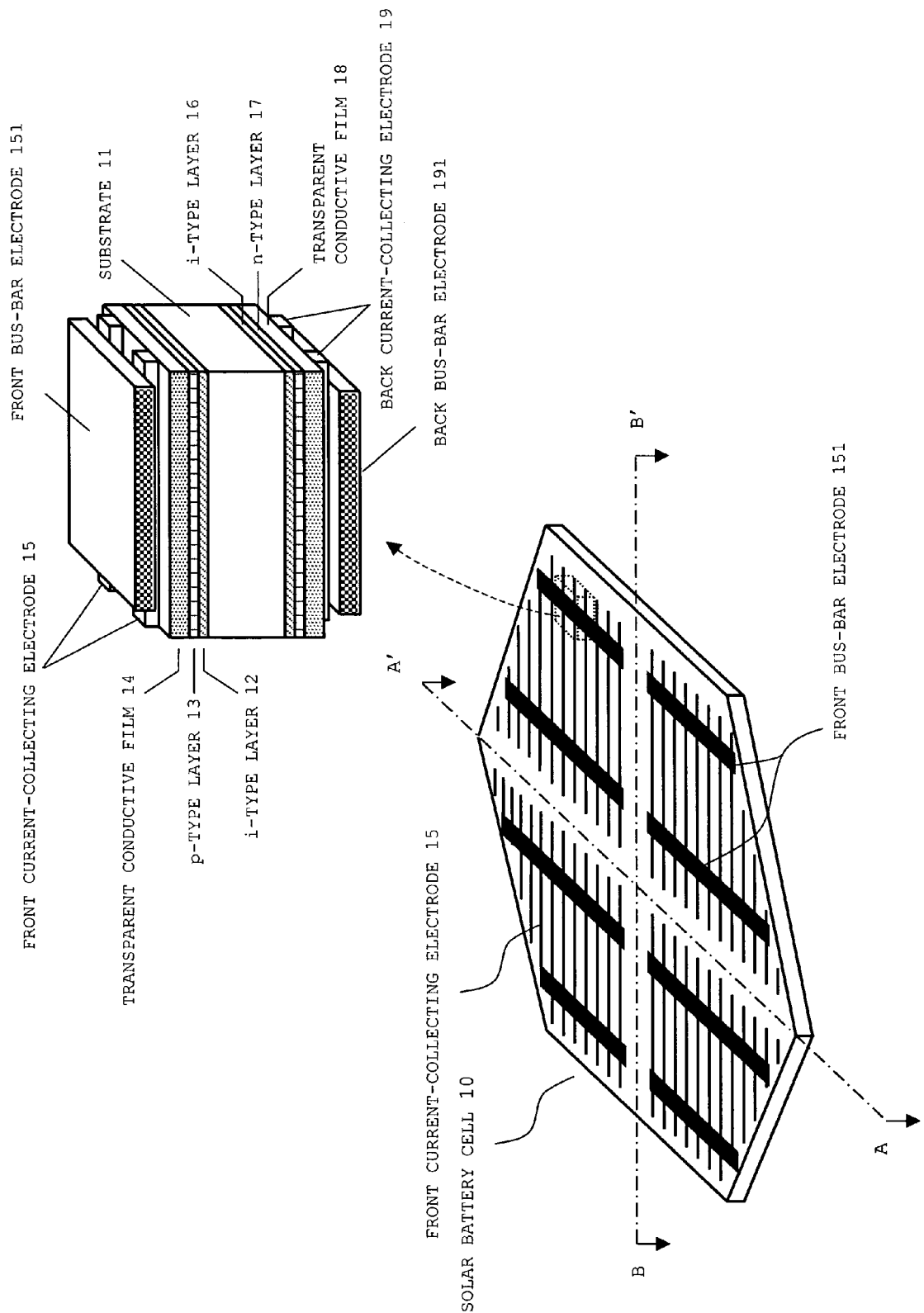
FIG. 1 illustrates a configuration of a solar battery cell according to one embodiment.

A lower left side of FIG. 1 illustrates a configuration of a solar battery cell which is not divided into four yet. As illustrated in the lower left side of FIG. 1, the solar battery cell 10 has a hexagonal shape when being seen from a plan view. In the solar battery cell 10, front current-collecting electrodes 15 and front bus-bar electrodes 151 are formed on a front surface and back current-collecting electrodes 19 and back bus-bar electrodes 191 are formed on a back surface.

An upper right side of FIG. 1 illustrates a sectional structure of the solar battery cell 10, which corresponds to a portion shown by dotted lines in the lower left side of FIG. 1. As illustrated in the upper right side of FIG. 1, the solar battery cell 10 includes a substrate 11, an i-type layer 12, a p-type layer 13, a transparent electrode film 14, the front current-collecting electrodes 15, an i-type layer 16, an n-type layer 17, a transparent conductive film 18, and the back current-collecting electrodes 19.

Figure 2:
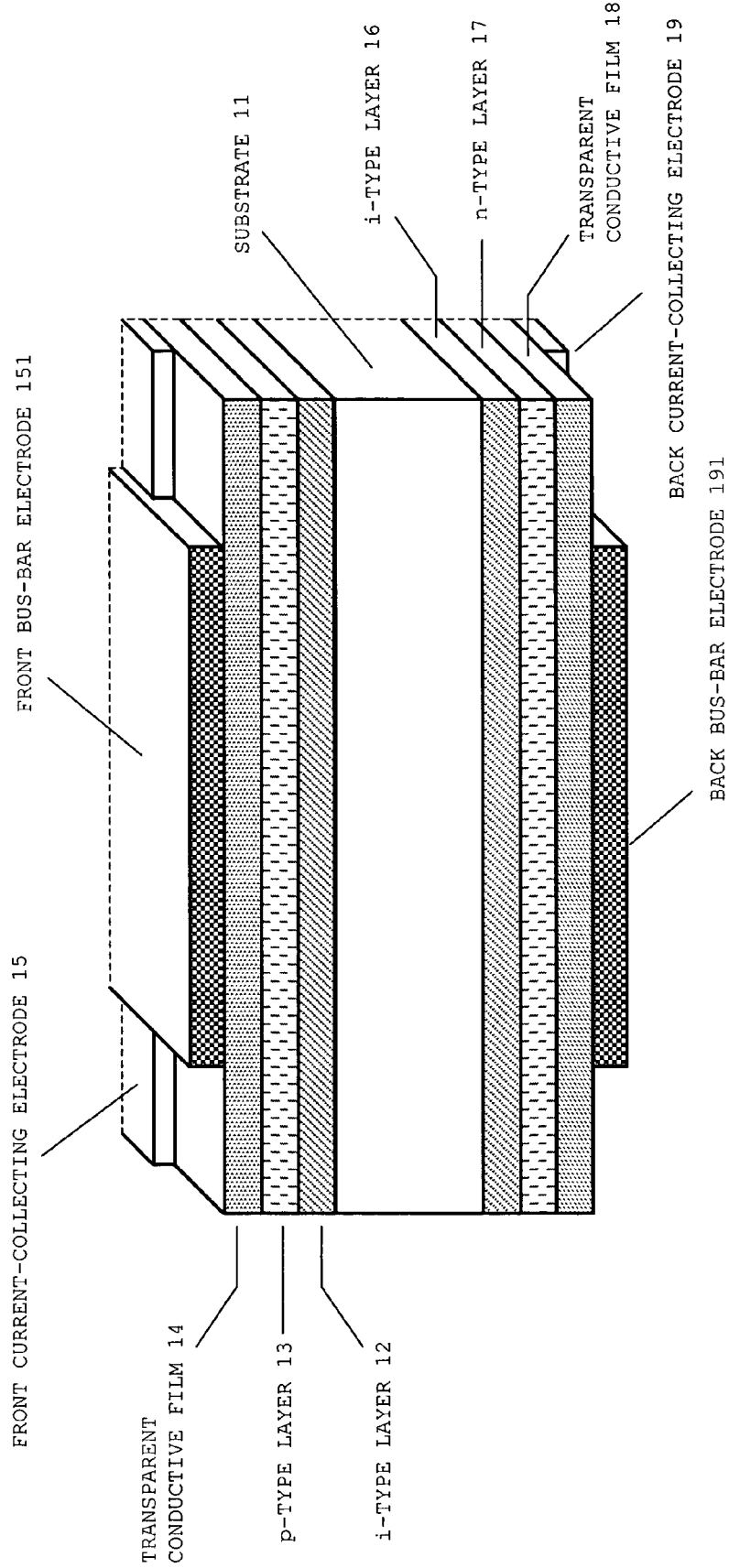
FIG. 2 illustrates a sectional structure of the solar battery cell according to the embodiment.

The substrate 11 is an n-type single-crystal silicon substrate. The i-type layer 12 made of intrinsic amorphous silicon and the p-type layer 13 made of p-type amorphous silicon are laminated in this order on a front surface of the substrate 11. Further, the transparent conductive film 14 is laminated on the p-type layer 13, and the front current-collecting electrodes 15 arranged linearly are formed on the transparent conductive film 14. The front bus-bar electrodes 151 are formed on the front current-collecting electrodes 15 so as to intersect the front current-collecting electrodes 15. On the other hand, the i-type layer 16 made of intrinsic amorphous silicon and the n-type layer 17 made of n-type amorphous silicon are laminated in this order on a back surface of the substrate 11. Further, the transparent conductive film 18 is laminated on the n-type layer 17, and the back current-collecting electrodes 19 arranged linearly are formed on the transparent conductive film 18. The back bus-bar electrodes 191 are formed on the back current-collecting electrodes 19 so as to intersect the back current-collecting electrodes 19. In FIG. 1, the front current-collecting electrode 15 and the front bus-bar electrode 151 are formed independently of each other. However, these electrodes may be formed integrally with each other as illustrated in FIG. 2. In FIG. 1, similarly, the back current-collecting electrode 19 and the back bus-bar electrode 191 are formed independently of each other. However, these electrodes may be formed integrally with each other as illustrated in FIG. 2.

In the solar battery cell 10 according to the embodiment, light from the front surface and light from the back surface are incident onto the substrate 11. Therefore, an optical electromotive force is generated irrespective of a light incident direction. Each of the i-type layers 12 and 16 has a thickness of about 100 angstroms. Each of the p-type layer 13 and the n-type layer 17 has a thickness of about 100 angstroms. Each of the transparent conductive films 14 and 18 is made of a translucent material such as ITO, ZnO or $SnO_2$. Each of the front current-collecting electrode 15, the back current-collecting electrode 19, the front bus-bar electrode 151 and the back bus-bar electrode 191 is made of a conductive metal material obtained by, for example, curing an Ag paste.

Figure 12B:
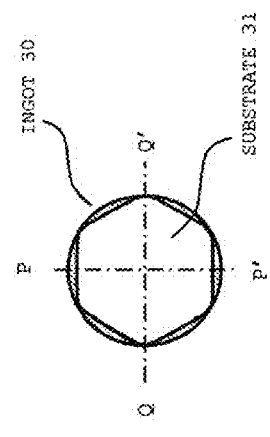
FIGS. 12A to 12C illustrate configurations in the prior invention.
Figure 12A:
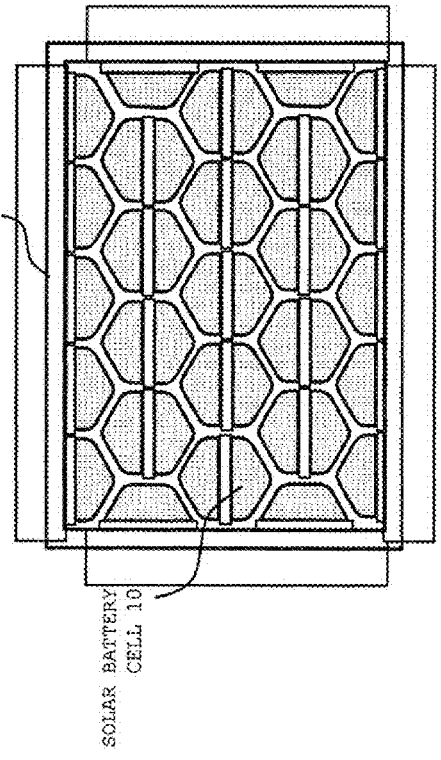
Figure 12C:
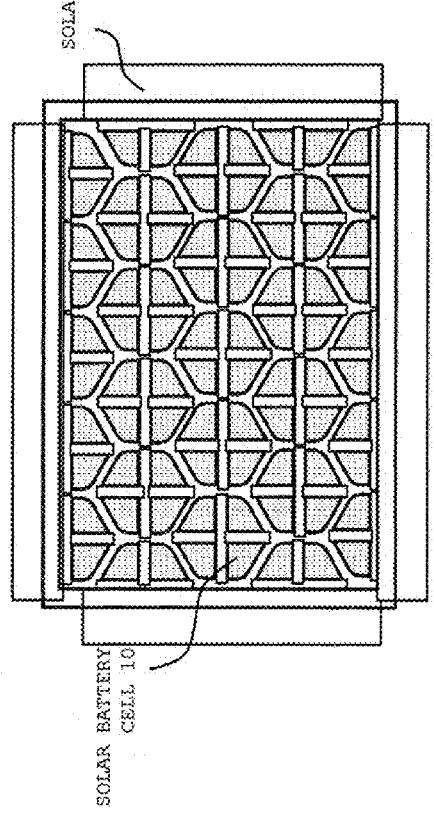
Figure 13B:
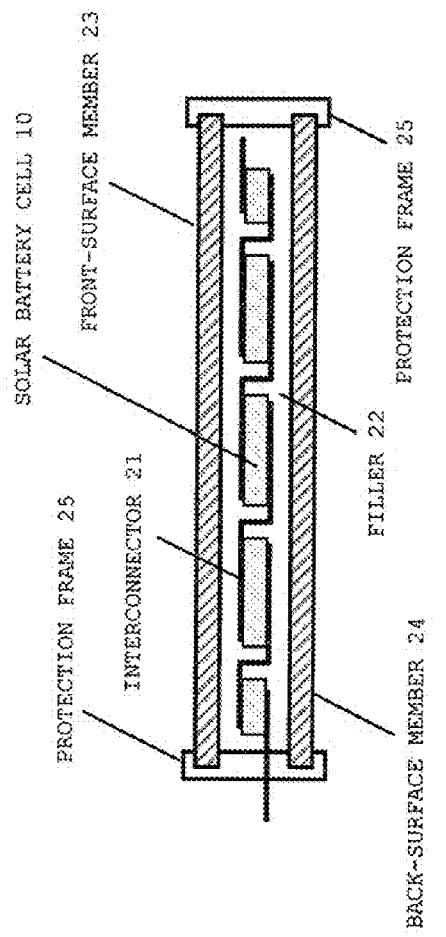
FIGS. 13A and 13B illustrate configurations in the prior invention.
Figure 13A:
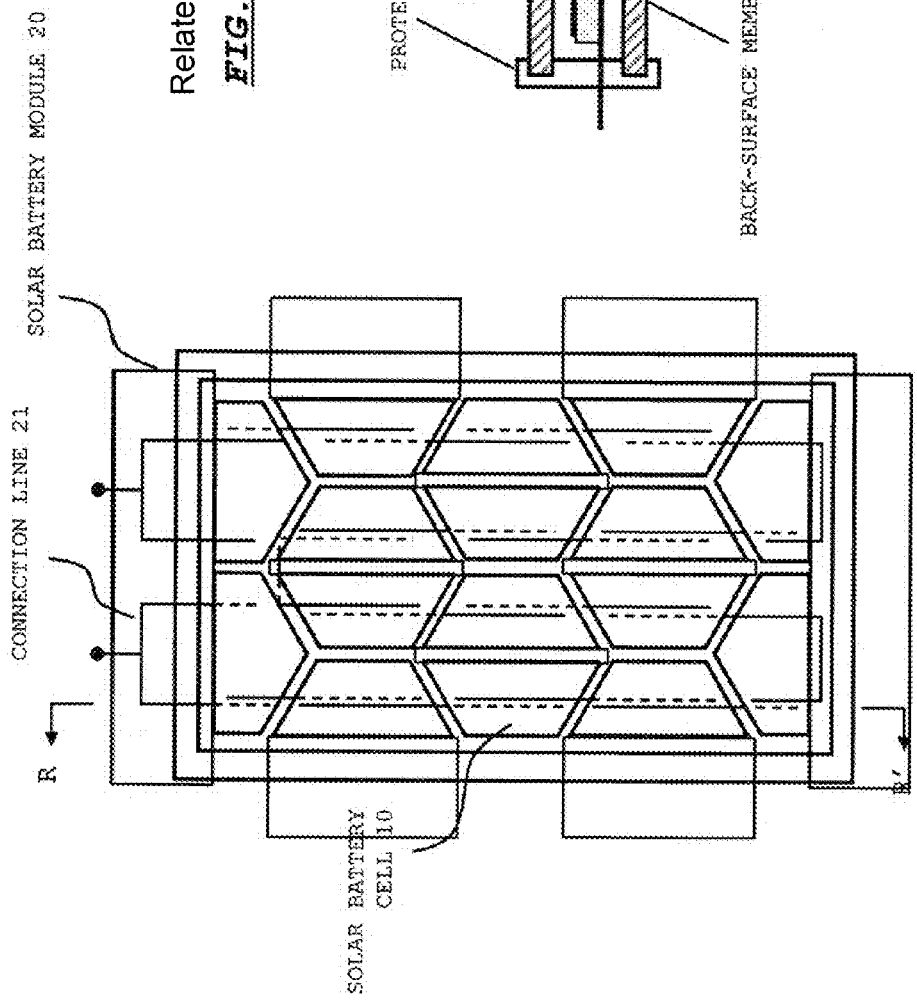

FIG. 1 illustrates the solar battery cell 10 having a hexagonal shape when being seen from a plan view. However, as illustrated in FIG. 12B, the solar battery cell 10 may have an almost hexagonal shape. As described above, further, the solar battery cell 10 is formed of a combination of a crystalline semiconductor material with an amorphous semiconductor material. In addition, the solar battery cell 10 may be of a double-sided incident type, which is formed of only one of a crystalline semiconductor material and an amorphous semiconductor material. Alternatively, the solar battery cell 10 may be of a single-sided incident type, wherein the back current-collecting electrodes 19 are not formed into a comb shape as illustrated in FIG. 1, but are formed into a uniform plane.

The solar battery cell 10 illustrated in FIG. 1 is divided into four trapezoidal parts at a straight line (line A-A' in FIG. 1) connecting two apexes and a straight line (line B-B' in FIG. 1) connecting two division points on opposed two sides. Two of the divided four parts are combined with each other without being turned upside down; thus, one cell unit (hereinafter, referred to as "unit") is configured.

Figure 3A:
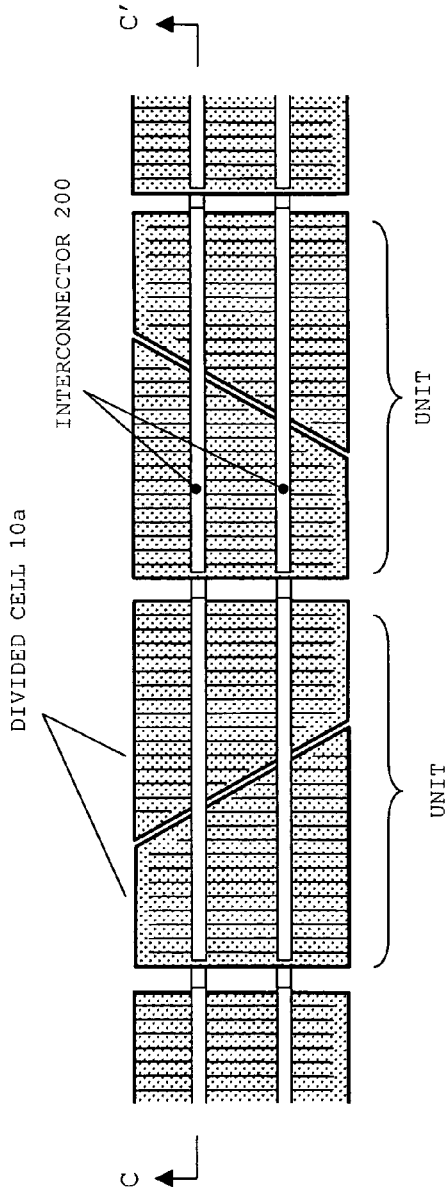
FIGS. 3A and 3B illustrate a connection form between divided cells and a connection form between units according to the embodiment.
Figure 3B:
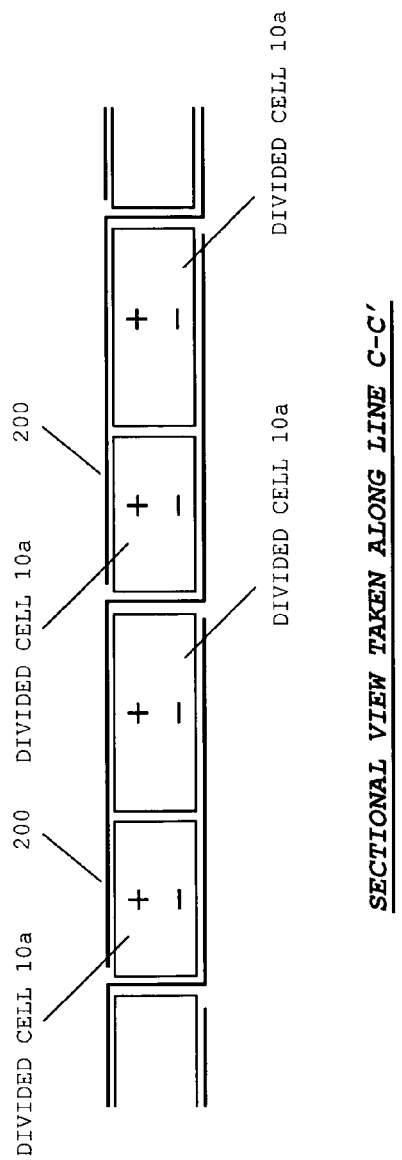

FIGS. 3A and 3B illustrate a configuration of a unit and a connection form between units.

More specifically, FIG. 3A is a top view of the unit, and FIG. 3B is a sectional view taken along a line C-C' in FIG. 3A. Hereinafter, each part obtained by dividing the solar battery cell 10 illustrated in FIG. 1 into four will be referred to as a "divided cell 10a".

In electrical connection between two divided cells 10a, the divided cells 10a are arranged without being turned upside down such that oblique sides thereof oppose each other without deviation. Then, two interconnectors 200 are placed on front bus-bar electrodes 151 on front surfaces of the divided cells 10a, and are electrically connected to the front bus-bar electrodes 151. Thus, the divided cells 10a are connected in parallel, so that one unit is configured.

Then, the interconnectors 200 on the front surfaces of the divided cells 10a that configure the aforementioned unit are routed to back surfaces of two divided cells 10a that configure an adjoining unit, and are electrically connected to back bus-bar electrodes 191 on the back surfaces of the divided cells 10a that configure the adjoining unit. Thus, the two units are connected in series through the interconnectors 200. Similarly, front bus-bar electrodes 151 of two divided cells 10a are electrically connected to back bus-bar electrodes 191 of two divided cells 10a through two interconnectors 200 in sequence.

For example, an interconnector 200 used herein is formed by dipping a copper plate having a thickness of about 150 μm and a width of about 2 mm into solder having no lead. Herein, a solder layer to be formed on each of front and back surfaces of the copper plate has a thickness of about 40 μm. The interconnector 200 is placed on one of a front bus-bar electrode 151 and a back bus-bar electrode 191. Then, the solder layer of the interconnector 200, which is in contact with the front bus-bar electrode 151 or the back bus-bar electrode 191, is melted by application of heat. Thus, the interconnector 200 is electrically connected to the front bus-bar electrode 151 or the back bus-bar electrode 191.

Figure 4:
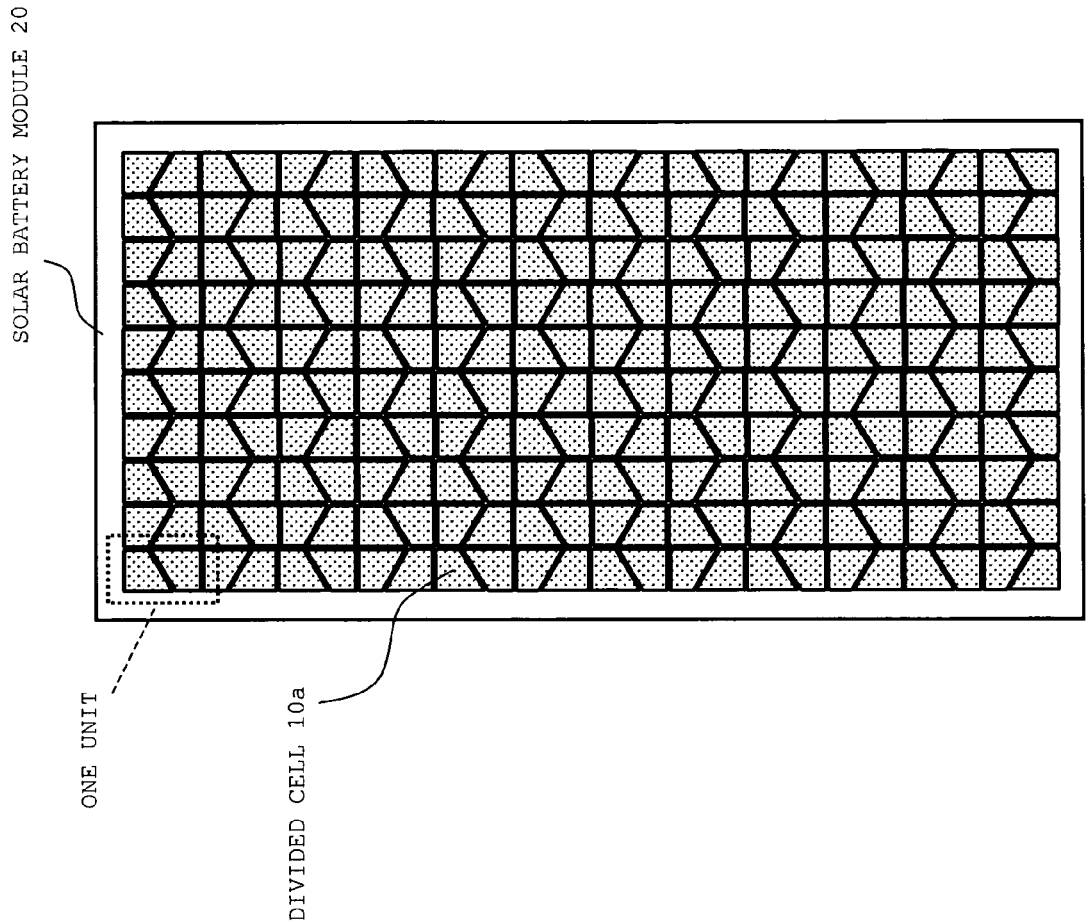
FIG. 4 illustrates a layout of the units according to the embodiment.

FIG. 4 illustrates a layout of units and a layout of divided cells 10a in a solar battery module. Typically, a solar battery module is manufactured as follows: a plurality of divided cells each connected to one another through interconnectors are sealed with a sealant in between a translucent front-surface protection layer and a translucent back-surface protection layer. However, the front-surface protection layer, the back-surface protection layer and the sealant are not illustrated in the following drawings. Divided cells 10a are electrically connected to one another in accordance with a predetermined electrical connection pattern. A method for configuring a unit and a method for electrically connecting between divided cells or units are already described above with reference to FIGS. 3A and 3B.

Figure 5:
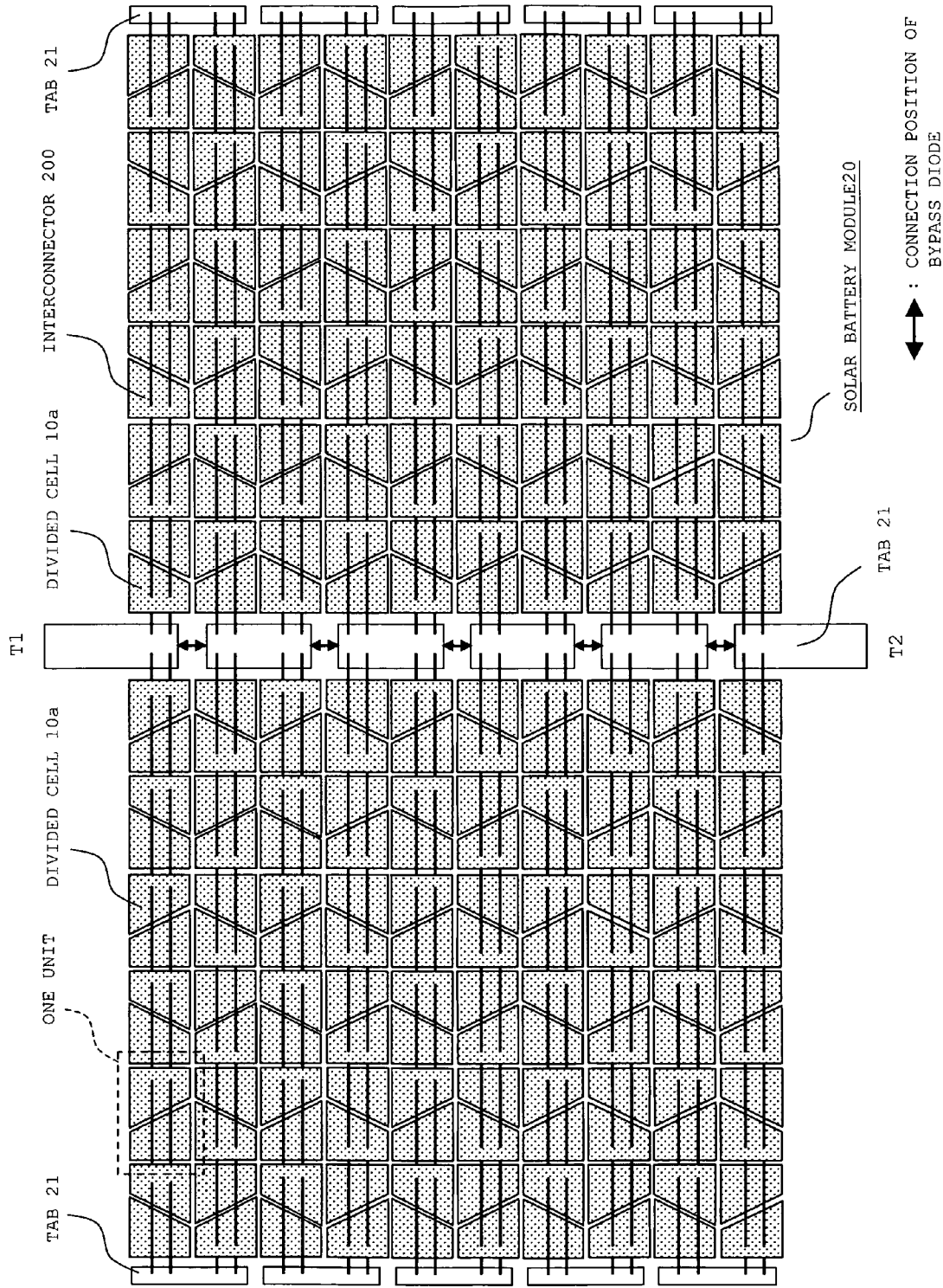
FIG. 5 illustrates one unit connection pattern according to the embodiment.

FIG. 5 illustrates one electrical connection pattern.

In this electrical connection pattern, units in each left row are sequentially connected leftward in series through interconnectors from a center of a solar battery module 20, and units in each right row are sequentially connected rightward in series through interconnectors from the center of the solar battery module 20. In unit groups of odd-numbered rows counted from above, that is, unit groups of first, third, fifth, seventh and ninth rows, back surfaces of units located at a center are electrically connected to tabs 21 located at the center of the solar battery module 20, respectively, and front surfaces of rightmost and leftmost units are electrically connected to tabs 21 located at both ends of the solar battery module 20, respectively. On the other hand, in unit groups of even-numbered rows counted from above, that is, unit groups of second, fourth, sixth, eighth and tenth rows, front surfaces of units located at a center are electrically connected to the tabs 21 located at the center of the solar battery 20, respectively, and back surfaces of rightmost and leftmost units are electrically connected to the tabs 21 located at the both ends of the solar battery module 20, respectively.

In the tabs 21 located at the center of the solar battery module 20, the uppermost tab 21 serves as an output terminal T1 of the solar battery module 20 and the lowermost tab 21 serves as an output terminal T2 of the solar battery module 20. In this electrical connection pattern, a bypass diode connects between adjoining tabs 21 located at the center of the solar battery module 20 in order to prevent application of reverse voltage, as shown by an arrow in FIG. 5. Herein, adjoining tabs 21 are close to each other at the position shown by an arrow in FIG. 5; therefore, a bypass diode can be readily inserted between the tabs 21. A bypass diode used herein may be interposed between a front-surface protection member and a back-surface protection member, or may be attached to a terminal box mounted to a bottom side of the back-surface protection member.

Figure 6:
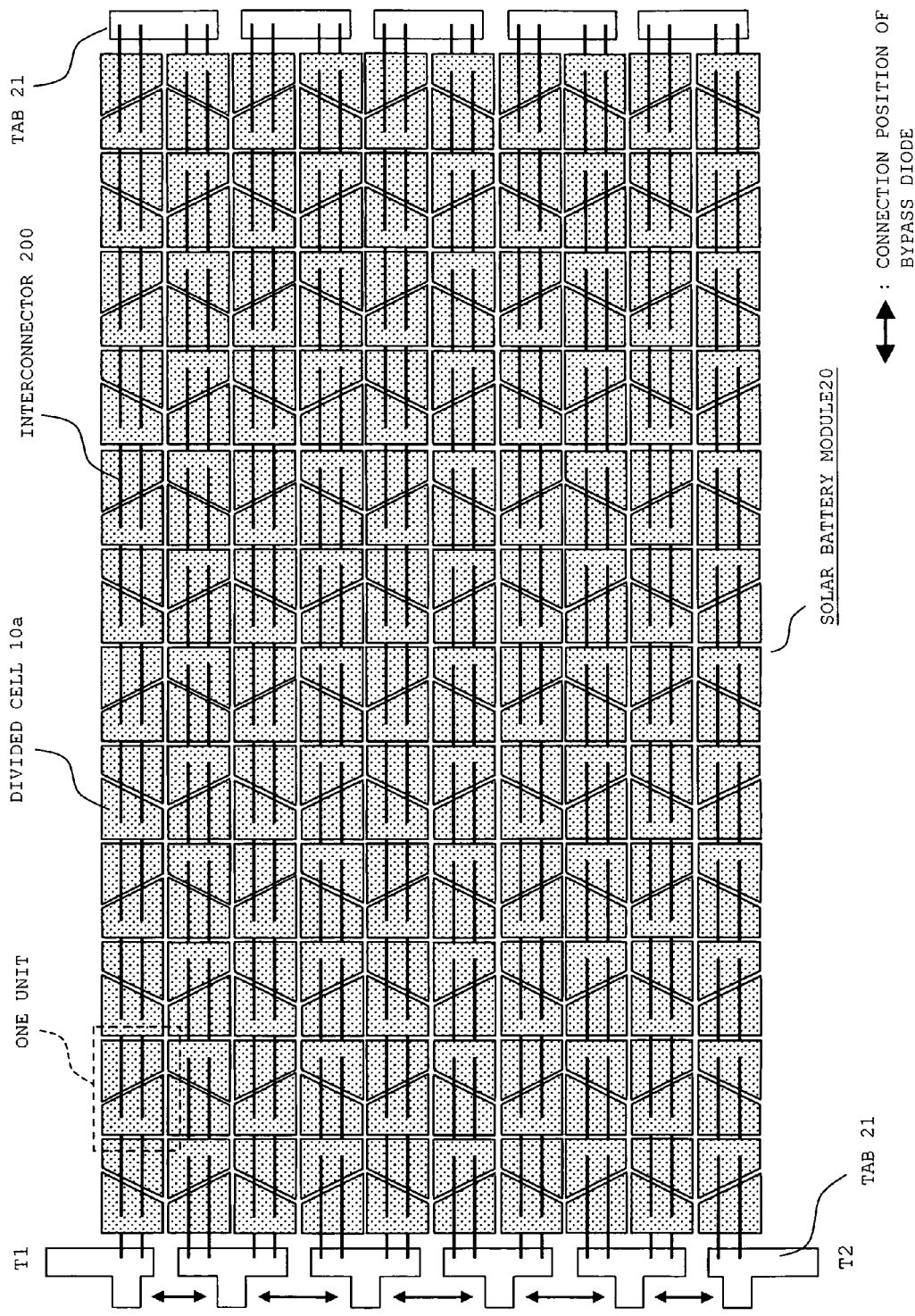
FIG. 6 illustrates another unit connection pattern according to the embodiment.

FIG. 6 illustrates another electrical connection pattern.

In this electrical connection pattern, units in each row are sequentially connected rightward in series from a left end of a solar cell module 20. In unit groups of odd-numbered rows counted from above, that is, unit groups of first, third, fifth, seventh and ninth rows, back surfaces of leftmost units are electrically connected to tabs 21 located at the left end of the solar battery module 20, and front surfaces of rightmost units are electrically connected to tabs 21 located at a right end of the solar battery module 20. On the other hand, in unit groups of even-numbered rows counted from above, that is, unit groups of second, fourth, sixth, eighth and tenth rows, front surfaces of leftmost units are electrically connected to the tabs 21 located at the left end of the solar battery module 20, and back surfaces of rightmost units are electrically connected to the tabs 21 located at the right end of the solar battery module 20. In this electrical connection pattern, accordingly, units from an upper leftmost one to a lower leftmost one in FIG. 6 are sequentially connected in series.

In the tabs 21 located at the left end of the solar battery module 20, the uppermost tab 21 serves as an output terminal T1 of the solar battery module 20 and the lowermost tab 21 serves as an output terminal T2 of the solar battery module 20. In this electrical connection pattern, a bypass diode connects between adjoining tabs 21 located at the left end of the solar battery module 20 in order to prevent application of reverse voltage, as shown by an arrow in FIG. 6. Herein, as in the case illustrated in FIG. 5, adjoining tabs 21 are close to each other at the position shown by an arrow in FIG. 6; therefore, a bypass diode can be readily inserted between the tabs 21. A bypass diode used herein may be interposed between a front-surface protection member and a back-surface protection member, or may be attached to a terminal box mounted to a bottom side of the back-surface protection member.

Figure 7:
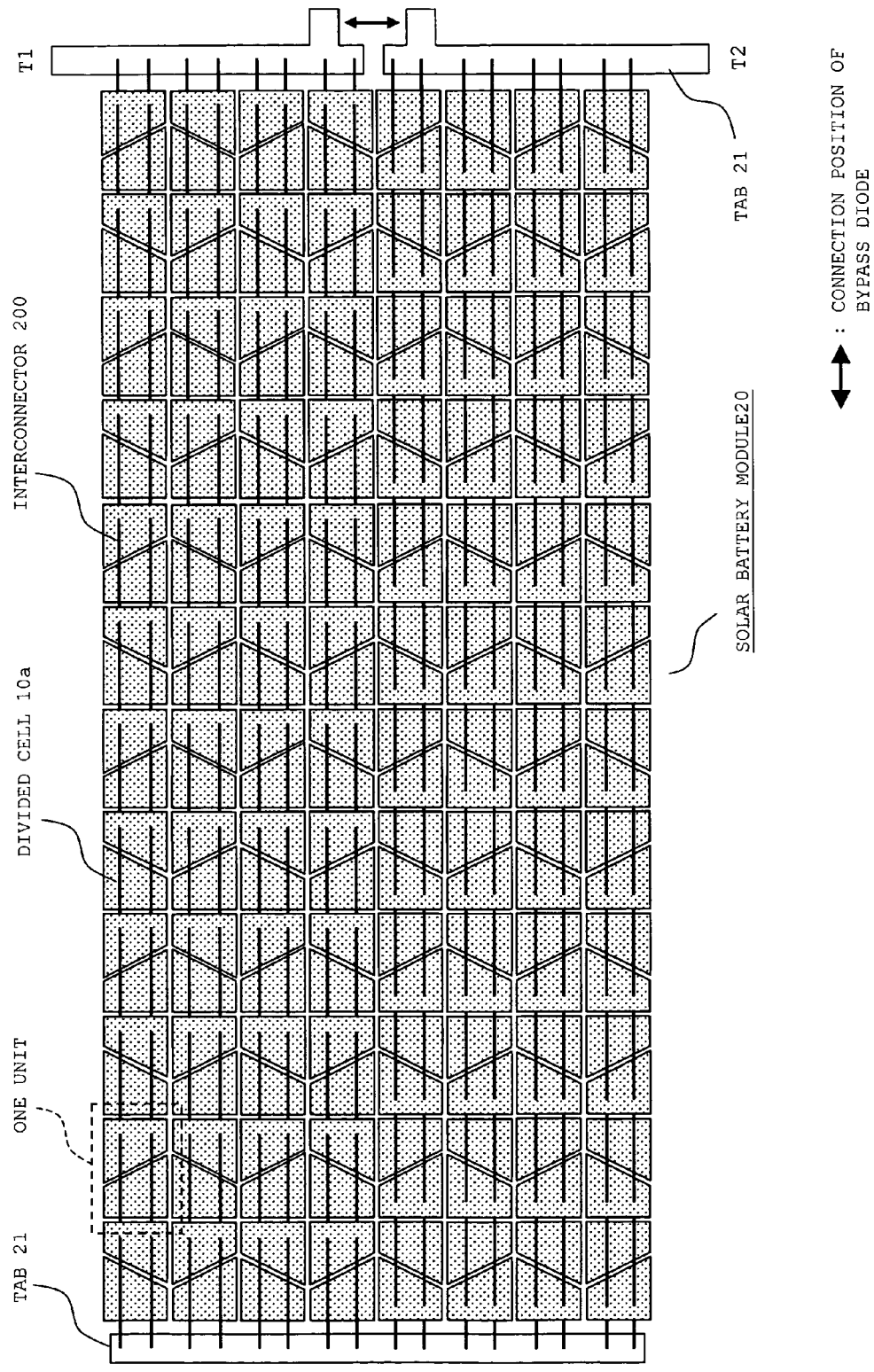
FIG. 7 illustrates still another unit connection pattern according to the embodiment.

FIG. 7 illustrates still another electrical connection pattern.

In this electrical connection pattern, units in each row are sequentially connected leftward in series from a right end of a solar battery cell 20. In unit groups of first, second, third and fourth rows counted from above, back surfaces of rightmost units are electrically connected to tabs 21 located at the right end of the solar battery module 20, respectively, and front surfaces of leftmost units are electrically connected to tabs 21 located at a left end of the solar battery module 20, respectively. On the other hand, in unit groups of fifth, sixth, seventh and eighth rows counted from above, front surfaces of rightmost units are electrically connected to the tabs 21 located at the right end of the solar battery module 20, respectively, and back surfaces of leftmost units are electrically connected to the tabs 21 located at the left end of the solar battery module 20, respectively. In this electrical connection pattern, accordingly, there is configured a solar battery module of a four parallel type wherein unit groups of first, second, third and fourth rows are connected in parallel, respectively, and unit groups of fifth, sixth seventh and eighth rows are connected in parallel, respectively.

Herein, the upper tab 21 located at the right end of the solar battery module 20 serves as an output terminal T1 of the solar battery module 20 and the lower tab 21 located at the right end of the solar battery module 20 serves as an output terminal T2 of the solar battery module 20. In this electrical connection pattern, a bypass diode connects between the upper and lower tabs 21 located at the right end of the solar battery module 20 in order to prevent application of reverse voltage, as shown by an arrow in FIG. 7. Herein, as in the cases illustrated in FIGS. 5 and 6, the tabs 21 are close to each other at the position shown by the arrow in FIG. 7; therefore, the bypass diode can be readily inserted between the tabs 21. In addition, there is required only one bypass diode herein, resulting in simplification of a configuration. A bypass diode used herein may be interposed between a front-surface protection member and a back-surface protection member, or may be attached to a terminal box mounted to a bottom side of the back-surface protection member.

Figure 8:
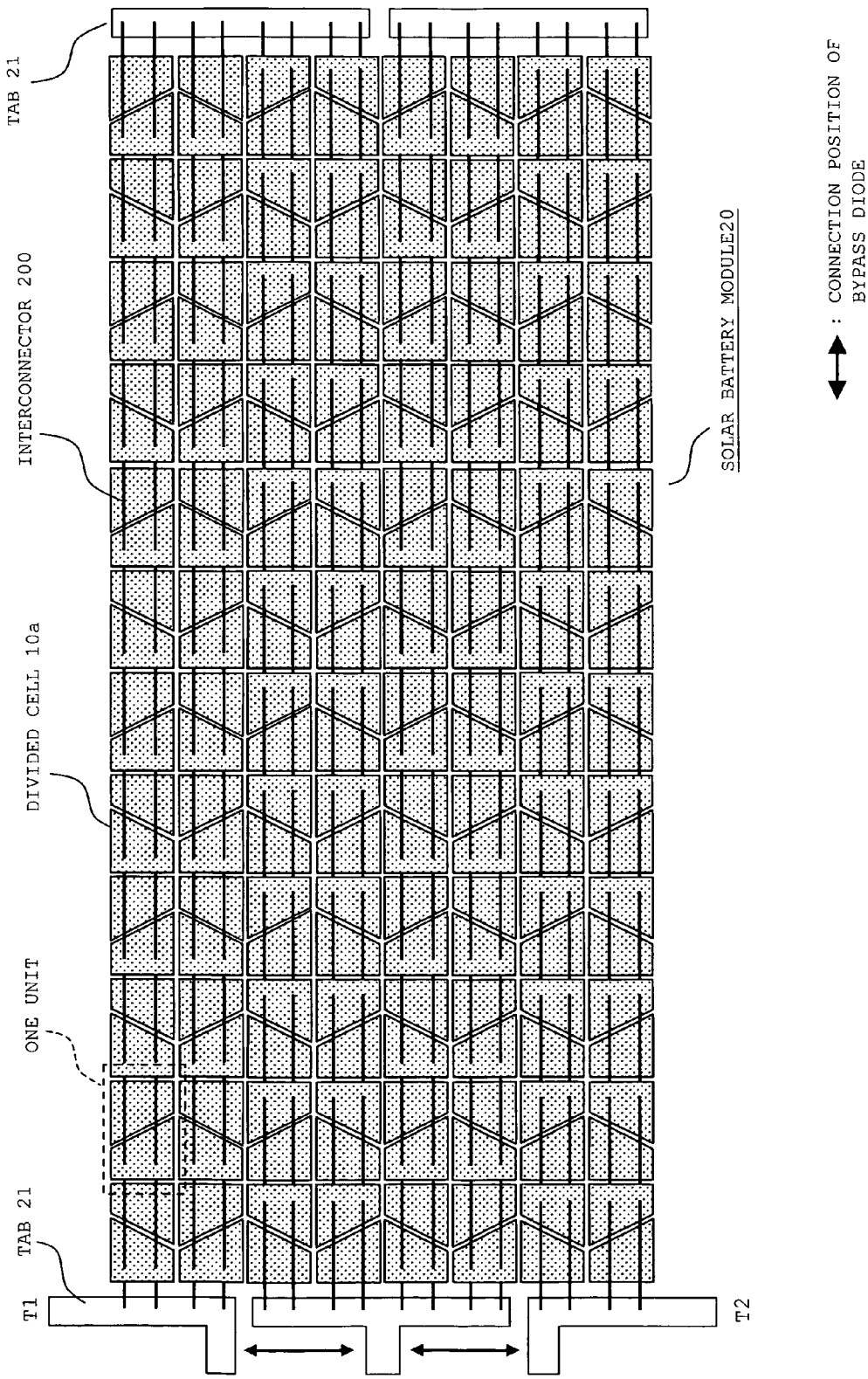
FIG. 8 illustrates yet another unit connection pattern according to the embodiment.

FIG. 8 illustrates yet another electrical connection pattern.

In this electrical connection pattern, units in each row are sequentially connected rightward in series from a left end of a solar battery module 20. In unit groups of first, second, fifth and sixth rows counted from above, back surfaces of leftmost units are electrically connected to tabs 21 located at the left end of the solar battery module 20, respectively, and front surfaces of rightmost units are electrically connected to tabs 21 located at a right end of the solar battery module 20, respectively. On the other hand, in unit groups of third, fourth, seventh and eighth rows counted from above, front surfaces of leftmost units are electrically connected to the tabs 21 located at the left end of the solar battery module 20, respectively, and back surfaces of rightmost units are electrically connected to the tabs 21 located at the right end of the solar battery module 20, respectively. In this electrical connection pattern, accordingly, there is configured a solar battery module of a two parallel type wherein unit groups of first and second rows are connected in parallel, unit groups of third and fourth rows are connected in parallel, unit groups of fifth and sixth rows are connected in parallel and unit groups of seventh and eighth rows are connected in parallel.

In the three tabs 21 located at the left end of the solar battery module 20, the upper and lower tabs 21 serve as output terminals T1 and T2 of the solar battery module 20, respectively. In this electrical connection pattern, a bypass diode connects between the tabs 21 located at the left end of the solar battery module 20 in order to prevent application of reverse voltage, as shown by an arrow in FIG. 8. Herein, as in the cases illustrated in FIGS. 5, 6 and 7, adjoining tabs 21 are close to each other at the position shown by an arrow in FIG. 8; therefore, a bypass diode can be readily inserted between the tabs 21. In addition, there are required only two bypass diodes herein, resulting in simplification of a configuration. A bypass diode used herein may be interposed between a front-surface protection member and a back-surface protection member, or may be attached to a terminal box mounted to a bottom side of the back-surface protection member.

FIG. 9 illustrates yet another electrical connection pattern. In the aforementioned respective electrical connection patterns, a combination of divided cells 10a is arranged in a lateral direction to configure one unit as illustrated in FIGS. 5 to 8. In this electrical connection pattern, on the other hand, a combination of divided cells 10a is arranged in a vertical direction to configure one unit as illustrated in FIG. 9.

In this electrical connection pattern, units in each column are sequentially connected downwardly in series from a top end of a solar battery module 20. In unit groups of first, second, fifth, sixth, ninth, tenth, thirteenth, fourteenth, seventeenth and eighteenth columns counted from left, back surfaces of uppermost units are electrically connected to tabs 21 located at the top end of the solar battery module 20, respectively, and front surfaces of lowermost units are electrically connected to tabs 21 located at a bottom end of the solar battery module 20. On the other hand, in unit groups of third, fourth, seventh, eighth, eleventh, twelfth, fifteenth, sixteenth, nineteenth and twentieth columns counted from left, front surfaces of uppermost units are electrically connected to the tabs 21 located at the top end of the solar battery module 20, respectively, and back surfaces of lowermost units are electrically connected to the tabs 21 located at the bottom end of the solar battery module 20, respectively. In this electrical connection pattern, accordingly, there is configured a solar battery module wherein unit groups of first and second columns are connected in parallel, unit groups of third and fourth columns are connected in parallel, unit groups of fifth and sixth columns are connected in parallel, unit groups of seventh and eighth columns are connected in parallel, unit groups of ninth and tenth columns are connected in parallel, unit groups of eleventh and twelfth columns are connected in parallel, unit groups of thirteenth and fourteenth columns are connected in parallel, unit groups of fifteenth and sixteenth columns are connected in parallel, unit groups of seventeenth and eighteenth columns are connected in parallel and unit groups of nineteenth and twentieth columns are connected in parallel.

In the tabs 21 located at the top end of the solar battery module 20, the leftmost tab 21 serves as an output terminal T1 of the solar battery module 20 and the rightmost tab 21 serves as an output terminal T2 of the solar battery module 20. In this electrical connection pattern, a bypass diode connects between tabs 21 located at the top end of the solar battery module 20 in order to prevent application of reverse voltage, as shown by an arrow in FIG. 9. Herein, as in the cases illustrated in FIGS. 5, 6, 7 and 8, adjoining tabs 21 are close to each other at the position shown by an arrow in FIG. 9; therefore, a bypass diode can be readily inserted between the tabs 21. A bypass diode used herein may be interposed between a front-surface protection member and a back-surface protection member, or may be attached to a terminal box mounted to a bottom side of the back-surface protection member.

According to the aforementioned embodiment, it is possible to exhibit the following effects.

(1) It is unnecessary to route an interconnector 200 from a back surface of one divided cell 10a to a front surface of another divided cell 10a and vice versa at a portion where oblique sides of the divided cells 10a oppose each other. Therefore, it is unnecessary to secure a large clearance at the portion, so that it is possible to effectively increase the number of solar battery cells to be placed on a solar battery module.

(2) It is unnecessary to route an interconnector 200 from a back surface of one divided cell 10a to a front surface of another divided cell 10a and vice versa at a portion where oblique sides of the divided cells 10a oppose each other. Therefore, it is possible to prevent the divided cells 10a at the portion from becoming chipped or cracked.

(3) As illustrated in FIGS. 3A and 3B, adjoining units are electrically connected to each other as follows: two interconnectors 200 are routed from a front surface of one of the units to a back surface of the other unit at a portion where two sides perpendicular to an extending direction of the interconnector 200 oppose each other. Therefore, the two interconnectors 200 can be bent at a substantially identical position in the extending direction thereof upon electrical connection between the two units. Hence, it is possible to enhance workability upon connection between two units through the interconnectors 200. Thus, it is possible to enhance a yield upon manufacturing of a solar battery module.

(4) In the electrical connection pattern illustrated in FIG. 5 or 9, the divided cells 10a placed on the solar battery module 20 have the front surfaces ("+" surfaces) directed in a single direction. Therefore, it is possible to configure a solar battery module 20 by using divided cells 10a of one type. Herein, the divided cells 10a can be sequentially placed on the solar battery module 20 in accordance with an electrical connection pattern without taking a type and an orientation of the divided cell 10a into consideration. Therefore, it is possible to facilitate work performed upon manufacturing of the solar battery module 20. Hence, it is possible to enhance a yield upon manufacturing of the solar battery module 20.

(5) As illustrated in FIGS. 3A and 3B, further, two divided cells 10a are connected in parallel to configure one unit. This case makes it possible to suppress a rise in voltage by about half in one unit as compared with a case that two divided cells 10a are connected in series to configure one unit. As illustrated in FIGS. 5 to 9, accordingly, it is possible to lessen the frequency of inserting a bypass diode, leading to simplification of the configuration of a solar battery module and improved workability.

(6) According to the electrical connection patterns illustrated in FIGS. 5 to 9, since insertion positions of bypass diodes are close to each other, an operation of inserting the bypass diode can be simplified. In particular, according to the electrical connection patterns illustrated in FIGS. 7 and 8, the number of bypass diodes to be inserted can be suppressed.

The present invention is not limited to the aforementioned embodiment, and can be modified variously.

In the aforementioned embodiment, a combination of two divided cells 10a configures one unit. Alternatively, as illustrated in FIGS. 10A and 10B, a combination of four divided cells 10a may configure one unit. The number of divided cells 10a for configuring one unit is changeable optionally. In FIGS. 10A and 10B, a block having a substantially rectangular contour is configured by combining two divided cells 10a such that the oblique sides thereof oppose each other, and two blocks are arranged on a plane such that shorter sides of the substantially rectangular contours thereof oppose each other to configure a unit having a substantially rectangular contour slenderer than the substantially rectangular contour of the block.

In the aforementioned embodiment, a tab 21 is disposed outside an arrangement region of a divided cell. However, such a tab 21 may be disposed at various positions such as a back surface of a divided cell.

The number of units arranged in a solar battery module is not limited to that illustrated in each of FIGS. 5 to 9, and may be varied appropriately. In the case illustrated in FIG. 6, for example, if the number of rows of units is an even number, output terminals T1 and T2 can be led out from a single side; however, if the number of the rows is an odd number, the output terminals T1 and T2 are led out from diagonal positions of opposed sides, causing difficulty in placement of a terminal box. Therefore, the number of units to be arranged may be determined appropriately in consideration of such points.

The present invention is applicable to not only a solar battery module receiving sunlight from a single side thereof, but also a solar battery module receiving sunlight from both sides thereof.

The embodiment of the present invention may be variously and appropriately modified within a scope of technical ideas in the following claims of the invention.

What is claimed is:

1. A solar battery module comprising:
   a plurality of trapezoid-shaped solar battery cells forming a rectangular contour in pairs such that oblique sides of two solar battery cells oppose each other, wherein
   the plurality of solar battery cells are arranged on a plane,
   an even number of solar battery cells are connected in parallel through an interconnector,
   the even number of solar battery cells connected in parallel include one or more than one group of two solar cells,
   each of the one or more than one group of two solar battery cells has a rectangular contour by arranging the two solar cells in a state that the oblique sides thereof oppose each other,
   a plurality of said even number of solar battery cells connected in parallel are arranged such that longer sides of the rectangular contours thereof oppose each other and shorter sides of the rectangular contours thereof oppose each other,
   the even number of solar cells connected in parallel are connected in series through the interconnector with an adjoining other even number of solar battery cells that are connected in parallel, and
   the interconnector does not pass through a gap between the oblique sides of the adjoining two solar cells but pass through a gap between the opposing sides of the two rectangular contour.

2. The solar battery module according to claim 1, comprising:
   a plurality of units each forming the rectangular contour by combining two solar battery cells such that the oblique sides thereof oppose each other, these two solar cells in the unit being connected in parallel through the interconnector, wherein
   the plurality of units are arranged in a matrix such that longer sides of the rectangular contours thereof oppose each other and shorter sides of the rectangular contours thereof oppose each other.

3. The solar battery module according to claim 2, wherein in the plurality of units, a front surface of one of adjoining two units is electrically connected to a back surface of the other unit in accordance with a predetermined electrical connection pattern in sequence.

4. The solar battery module according to claim 3, wherein in a portion where shorter sides of the adjoining two units oppose each other, the interconnector is routed from a front surface of one of the units to a back surface of the other unit for electrical connection between the front surface and the back surface.

5. The solar battery module according to claim 1, comprising:
   a plurality of blocks each forming the rectangular contour by combining two solar battery cells such that the oblique sides thereof oppose each other, wherein
   the plurality of blocks are combined such that shorter sides of the rectangular contours thereof oppose each other to configure a unit having a rectangular contour slenderer than the rectangular contour of the block, the solar battery cells in the unit being connected in parallel through the interconnector, and
   the plurality of units are arranged in a matrix such that longer sides of the rectangular contours thereof oppose each other and shorter sides of the rectangular contours thereof oppose each other.

6. The solar battery module according to claim 5, wherein in the plurality of units, a front surface of one of adjoining two units is electrically connected to a back surface of the other unit in accordance with a predetermined electrical connection pattern in sequence.

7. The solar battery module according to claim 6, wherein in a portion where shorter sides of the adjoining two units oppose each other, the interconnector is routed from a front surface of one of the units to a back surface of the other unit for electrical connection between the front surface and the back surface.

8. The solar battery module according to any one of claims 1 to 7, wherein
   the solar battery cells placed on the solar battery module are identical in type to one another, and are arranged on a plane such that identical polarities thereof are directed to a single direction.

9. A solar battery module comprising:
   a unit including a plurality of trapezoid-shaped solar battery cells forming a substantially rectangular contour in pairs such that oblique sides thereof oppose each other; and
   an interconnector for electrically connecting between the solar battery cells in the unit, wherein
   the unit is formed into a square shape by the plurality of solar battery cells,
   the interconnector connects between the solar battery cells configuring the unit without being routed from a front surface of one of the solar battery cells to a back surface of the other solar battery cell and vice versa at a portion where the oblique sides of the solar battery cells oppose each other, the unit is constructed with an even number of solar cells connected in parallel through the interconnector, the unit includes one or more than one group of two solar cells, each of the one or more than one group of two solar cells has a substantially rectangular contour by arranging the two solar cells in a state that the oblique sides thereof oppose each other, a plurality of units are arranged in a matrix on a plane, the unit is connected to an adjoining other unit in series through the interconnector, the interconnector passes through a gap between the opposing sides of the two rectangular contour.

* * * * *